(12) United States Patent
Kusunoki (10) Patent No.: US 6,452,447 B2
(45) Date of Patent: Sep. 17, 2002

(54) ADAPTIVE DISTORTION-COMPENSATION APPARATUS

(75) Inventor: Shigeo Kusunoki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/891,839

(22) Filed: Jun. 26, 2001

(30) Foreign Application Priority Data

Jun. 28, 2000 (JP) ........................................ 2000-195005

(51) Int. Cl.[7] .............................. H03F 1/26; H04K 1/02
(52) U.S. Cl. ...................................... 330/149; 375/297
(58) Field of Search ................................ 330/107, 151; 4/129, 149; 375/297

(56) References Cited

U.S. PATENT DOCUMENTS

| | | | | |
|---|---|---|---|---|
| 5,959,500 A | * | 9/1999 | Garrido | 375/297 |
| 6,029,285 A | * | 2/2000 | Belcher et al. | 330/149 |
| 6,133,789 A | * | 10/2000 | Braithwaite | 330/149 |

* cited by examiner

Primary Examiner—Robert Pascal
Assistant Examiner—Khanh Van Nguyen
(74) Attorney, Agent, or Firm—Jay H. Maioli

(57) ABSTRACT

An adaptive distortion-compensation apparatus that can perform conversion of the output of a power amplifier to a base band signal without using an orthogonal demodulator is constructed of first envelope detection means DET1 that has input thereto a high-frequency input signal whose envelope fluctuates and from that there is obtained first envelope detection signal, a read/write storage RAM1 that has supplied thereto an address signal based on the first envelope detection signal to have read out therefrom an output data signal and that has written therein a write data signal, a latch LCH that latches an output data signal that has been read out from the storage RAM1, a second envelope detection DET2 that has supplied thereto an output signal of a power amplifier the distortion of which is to be compensated and that has obtained therefrom a second envelope detection signal, and a difference sign detection/logical converter that outputs a digital value corresponding to the difference between the first and the second envelope detection signals, whereby the respective output signals of the latch and the sign detection/logical converter are added together and the resulting addition signal is written into the storage RAM1.

4 Claims, 12 Drawing Sheets

ADAPTIVE DISTORTION-COMPENSATION APPARATUS

BACKGROUND OF THE INVENTION

1. Field of the Invention

The present invention relates to a distortion-compensation apparatus, and more particularly to an adaptive distortion-compensation apparatus that can be applied to a high-frequency power amplifier.

2. Description of the Related Art

With a recent increase in the speed and capacity of the communication, there has been a more severe demand for linearity that is made of the transmission power amplifier in the digital wireless communication apparatus. This simultaneous has raised the problem of obstructing the increase in the power efficiency of the power amplifier.

On the other hand, the continuous phone talk duration of the digital portable telephone has solely become increasingly longer. For this reason, when putting a new digital wireless communication apparatus into the market, from the viewpoint of the product's competing ability the increase in the time period of continuous use thereof has been becoming non-ignorable. Nowadays, therefore, the movement of improving the power efficiency by introducing a technique of compensating the distortion of the power amplifier has been becoming more and more vigorous. However, such a distortion-compensation technique has become very large in terms of the scale of its relevant circuit. Therefore, that distortion-compensation technique has become virtually impossible to realize in the portable telephone the merit of that is that it is small in size and light in weight.

Further, on account of the property of the portable telephone, the environment in that it is used drastically fluctuates. Therefore, it is prerequisite to make the distortion compensation follow such a drastic fluctuation, i.e. an adaptive one. This conversion to an adaptive distortion-compensation has been becoming a very important task along with the conversion of the portable telephone to a small-sized version.

As the conventional techniques, there are several reports including the technique in which pre-distortion is made adaptive, the technique in which feedforward is made adaptive, etc. In the present invention, it is intended to provide an adaptive distortion-compensation apparatus that is used for achieving pre-distortion. Therefore, several conventional examples in that field are illustrated below.

Figure 1:
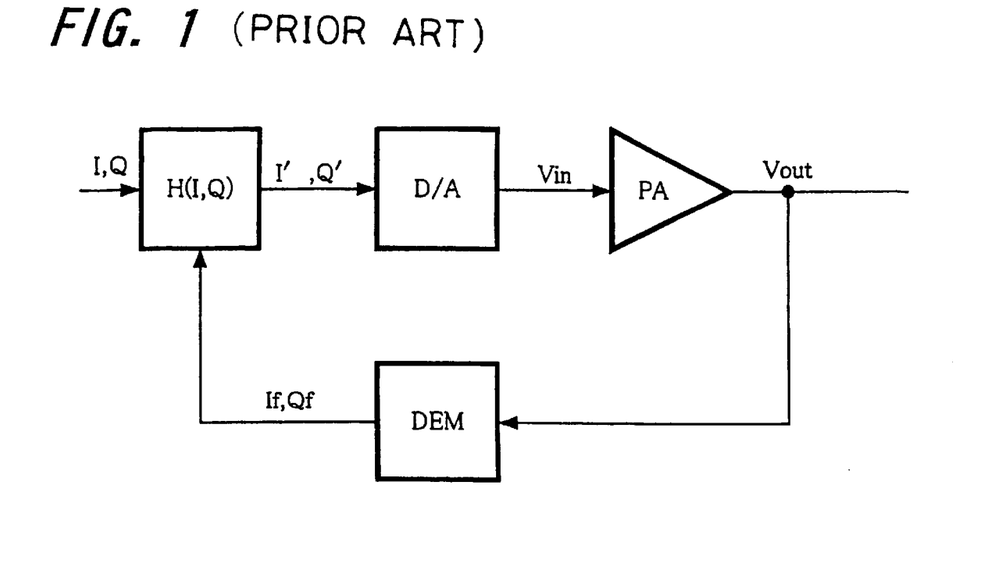
FIG. 1 is a block diagram illustrating a first conventional example of the adaptive distortion-compensation apparatus.

As a first conventional example, there is, for example, 1992. European Microwave Conference. Vol. 22, pp. 1125–pp. 1130, "Power Amplifier Adaptive Linearization Using Predistortion with Polynominal". In FIG. 1, there is illustrated a block diagram of an adaptive distortion-compensation apparatus that is introduced there.

In FIG. 1, assuming that Vout=A (Vin) represents the non-linear input/output characteristic of a power amplifier PA the distortion of that is to be compensated, input base band signals I and Q are arithmetic-operated using a function circuit H (I, Q) for linearizing that A (Vin). And the operated results I' and Q' are made analog by the use of a digital/analog converter D/A and simultaneously are each converted to a high-frequency band. And the resulting signals are input to the power amplifier PA. The resulting amplified outputs Vout are detected and they are converted to base band signals by the use of a demodulator DEM. Signals If and Qf are thereby obtained.

Here, adaptive compensation is performed in such a way as to compare the input signals I and Q with the detection signals If and Qf and to adjust the constants contained in the linearizing function H (I, Q) so that that difference may become zero. This operation is repeatedly carried out until that difference becomes zero. The constants contained in the function H (I, Q) are thereby determined to a final, optimum value.

Figure 2:
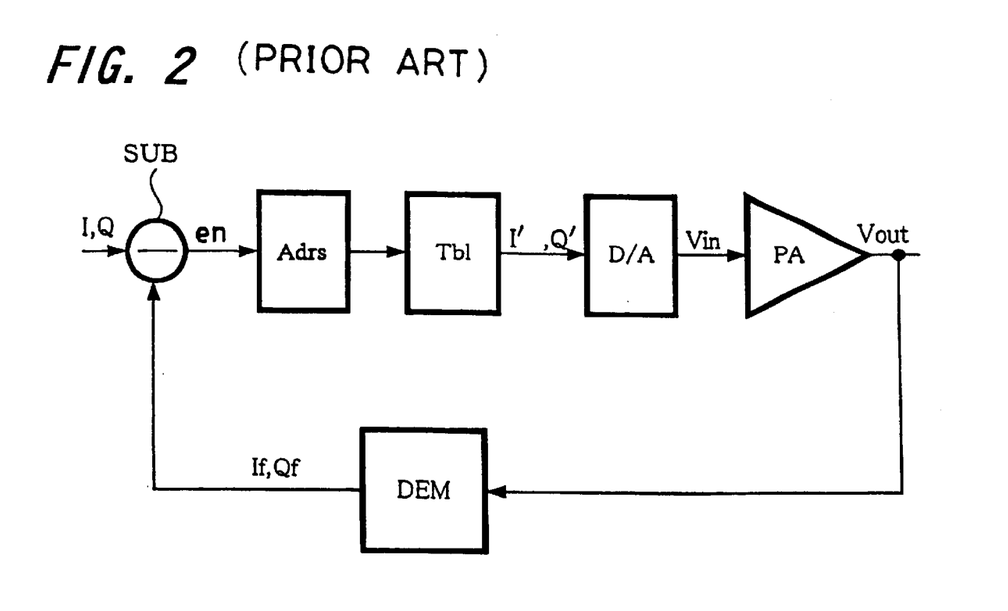
FIG. 2 is a block diagram illustrating a second conventional example of the adaptive distortion-compensation apparatus.

As a second conventional example, there is, for example, IEEE Transaction on Vechicular Technologies, Vol. 43, No. May 2, 1994, pp. 323–pp. 332. "Adaptive Linearization Using Pre-distortion". In FIG. 2 there is illustrated a block diagram of an adaptive distortion-compensation apparatus that is introduced there.

In FIG. 2, for better understanding of the explanation, the signals that have the same functions as those of the signals of FIG. 1 are represented by the same reference symbols. Generating adresses corresponding ro the input signals I and Q data signal conversion is performed by accessing a conversion table Tbl. Thereby, there are obtained data signals I' and Q' capable of linearizing the power amplifier PA, the data signals I' and Q' being input to the power amplifier PA. It is thereby arranged to detect the amplified output signal Vout and to convert it to a base band signal with use of the demodulator DEM, thereby obtaining the signals If and Qf.

Here, in the adaptive compensation, the input signals I and Q and the detection signals If and Qf are compared with each other. Namely, in a subtractor-SUB, a difference (en) is determined between each of the input signals I, Q and a corresponding one of the detection signals If, Qf. And this conventional technique has an address generation part Adrs. This address generation part is intended to adjust the address in correspondence with that access is had to the table Tbl, so as for that difference (en) to become zero. And, until that difference (en) becomes exactly zero, there is repeatedly adjusted the address generation part Adrs, to thereby optimize the address value for accessing the conversion table Tbl.

In the above-described first and second conventional examples, the constants contained in the linearizing function, or the address for accessing the linearizing table, is optimized. However, in any one of those conventional examples, it is necessary to use a demodulator for converting the output of the power amplifier to a base band signal. Generally, an orthogonal demodulator is used as that demodulator. Therefore, each of those conventional examples has a drawback that the scale of the relevant circuitry becomes greatly massive.

SUMMARY OF THE INVENTION

Therefore, the present invention is an adaptive distortion-compensation apparatus that can convert the output of the power amplifier to a base band signal without using an orthogonal demodulator.

An adaptive distortion-compensation apparatus according to the present invention is characterized by comprising: first envelope detection-means for obtaining a first envelope detection signal of an input signal; first storage means, supplied with an address signal based on the first envelope detection signal, for outputting an amplitude compensation data signal corresponding to the address signal; second storage means, supplied with the address signal based on the first envelope detection signal, for outputting an output data signal corresponding to the address signal, and for writing write-in data; latch means for latching output data read out from the second storage means; a power amplifier; second envelope detection means, supplied with an output signal of the power amplifier, for obtaining a second envelope detection signal; signal detection/logical conversion means for outputting plus and minus digital signals in accordance with plus and minus signs of the difference between the first envelope detection signal and the second envelope detection signal; first addition means for adding an output signal of the latch means and an output signal of the sign detection and logical conversion means, and for supplying the added signals to the second storage means as the write-in data; second addition means for adding an output signal of the first storage means and the output signal of the latch means, and for obtaining a second addition output signal; first digital to analog conversion means for converting an output signal of the second addition means into an analog signal, and for supplying the analog signal to the power amplifier; and gain control means, supplied with the input signal, for controlling a gain of the input signal in accordance with an output of the first digital-to-analog conversion means, and for supplying the gain-controlled input signal to the amplification circuit. Further, the adaptive distortion-compensation apparatus comprises third storage means, supplied with the address signal based on the first envelope detection signal, for outputting a phase compensation data signal corresponding to the address signal; second digital to analog conversion means for converting the phase compensating data outputted from the third storage means into an analog signal; and phase control means, supplied with the input signal, for controlling a phase of the input signal in accordance with an output signal of the second digital to analog conversion means, and for supplying the phase-controlled resultant input signal to the gain control means.

DESCRIPTION OF THE PREFERRED EMBODIMENTS

Figure 3:
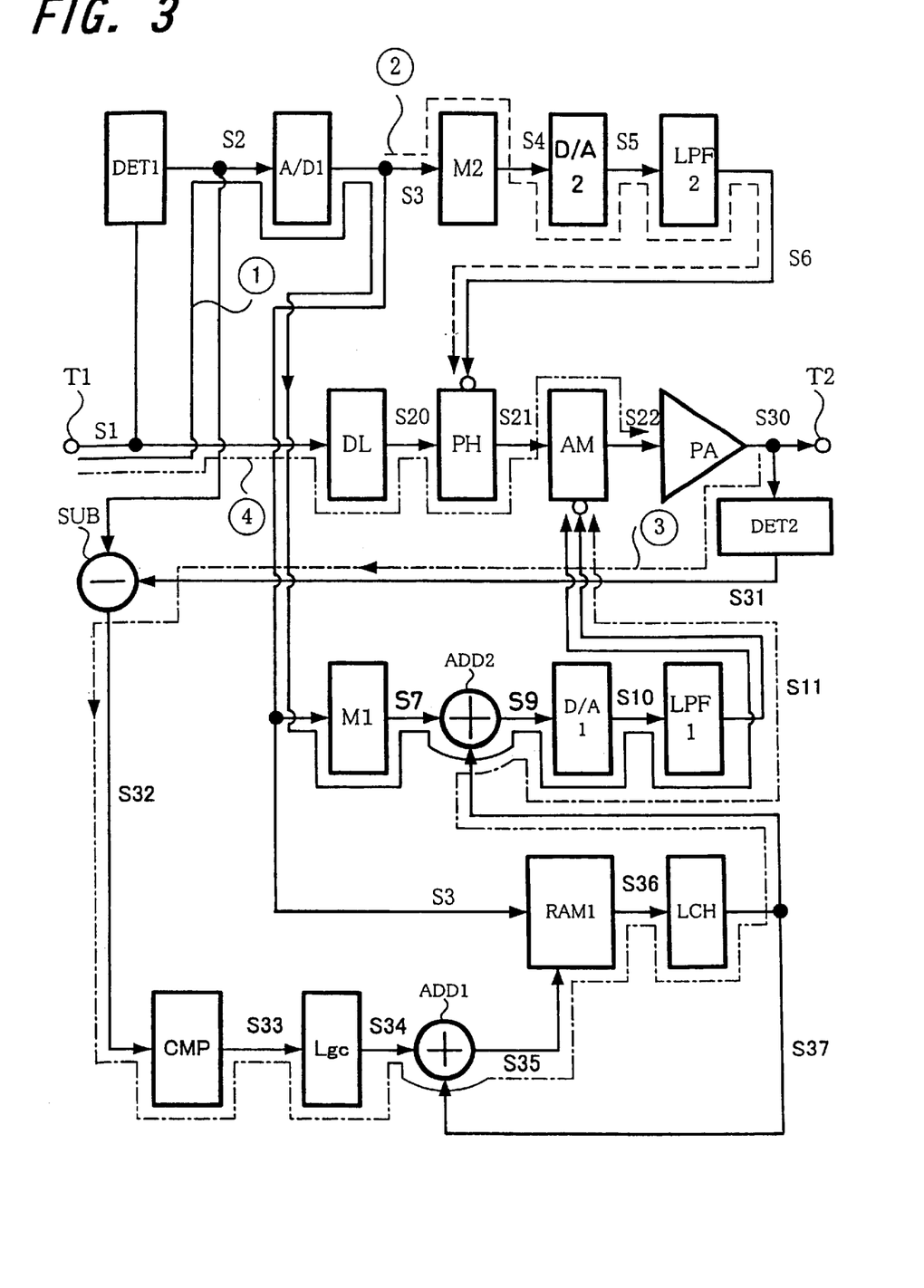
FIG. 3 is a block diagram illustrating an example of an adaptive distortion-compensation apparatus according to an embodiment of the present invention.

An adaptive distortion-compensation apparatus according to an embodiment of the present invention will hereafter be explained with reference to the drawings. FIG. 3 is a block diagram illustrating an example of that adaptive distortion-compensation apparatus. In this adaptive distortion-compensation apparatus of FIG. 7, there are four routes that will be described below.

A first route (1) is a route for correcting the amplitude distortion, and includes the following. Namely, an input signal is supplied to an input terminal T1 and a first envelope detection part DET1 that has input thereto a part of a high-frequency input signal S1 whose envelope fluctuates and that detects the envelope S2. An analog/digital converter A/D1 that digitizes the thus-detected envelope S2 and that outputs a digital signal S3. A first memory M1 that has input thereto as an address the digital signal S3 and that reads out amplitude correction data S7 (the data stored beforehand as amplitude correction data) corresponding to that address. An adder ADD2 that adds an output S37 of the memory M1 and a digital signal S37 as later described together. A-digital/analog converter D/A1 that converts that addition output S9 to an analog signal S10. And, a low pass filter LPF1 that eliminates digital noises contained in the analog signal S10.

A second route (2) is a route for correcting the phase distortion, and includes the following. A second memory M2 that has input thereto as an address a digital signal S3 that is supplied from the analog/digital converter A/D1. The second memory M2 reads out phase correction data (the data stored beforehand as the one for use for phase correction) that corresponds to that address and outputs that phase correction data signal. A digital/analog converter D/A2 that converts an output S4 of the memory M2 to an analog signal S5. And, a low pass filter LPF2 that eliminates digital noises contained in the analog signal S5.

A third route (3) is a route for performing adaptive compensation of the amplitude distortion, and includes the following. A second envelope detection part DET2 that detects an envelope S31 of the output S30 of a power amplifier PA whose distortion is to be compensated. An analog subtractor SUB that outputs as a difference signal S32 the difference between the envelope S2 that has been detected by the first envelope detection part DET1 and the envelope S31 that has been detected by the second envelope detection part DET2. A sign detector CMP that detects the sign of that signal S32 and that outputs a sign detection output signal S33. A logical conversion part Lgc that in case that signal S33 has a plus value outputs a digital value of +1 as a signal S34 and in case the signal S33 has a minus value outputs a digital value of −1 as the signal S34. A first adder ADD1 that performs digital addition of a signal S37 supplied from a latch circuit LCH as later described and a signal S34 output from the logical conversion part Lgc. A readout/write-in memory RAM 1 that by using as an address the digital signal S3 output from the analog/digital converter A/D1 reads out therefrom the data stored therein and outputs the thus-read-out data signal as a signal S36. The read-out/write-in memory RAM 1 simultaneously has written therein a signal S35 as later-described. The latch circuit LCH that latches an output signal S36 of the memory RAM1 and outputs the latch signal S37. A second adder ADD2 that digital-adds up the signal S37 and the signal S7 together and outputs an addition signal S9. A first digital/analog converter D/A1 that by performing analog conversion of that addition signal S9 outputs an analog signal S10. And, the low pass filter LPF1 that inputs that analog signal S10 and outputs a signal S11 the digital noises of that have been eliminated.

A fourth route (4) is a route for permitting the passage of a high-frequency signal therethrough, and includes the following. A delay element DL that has input thereto the high-frequency signal S1 from the input terminal T1 and has output therefrom a signal 20 that has been delayed by a prescribed length of time. A phase shifter PH that has input thereto the output signal S20 supplied from that delay element DL. The phase shifter PH has a control terminal to that has supplied thereto the output signal S6 of the second low pass filter LPF2. The phase shifter PH thereby outputs a signal S21 the phase of that has been shifted correspondingly to that output signal S6. A gain-variable part AM that has input thereto the output signal S21 of the phase shifter PH. The gain-variable part AM has a control terminal to that there is supplied an output signal S11 of the first low pass filter LPF1. The gain-variable part AM has its passage gain controlled depending upon that output signal S11. And, a power amplifier PA that has input thereto an output signal S22 of the gain-variable part AM and corrects the distortion of it and thereby outputs a signal S30.

Next, the operation of the above-described adaptive distortion-compensation apparatus of FIG. 3 will be explained below. To begin with, an explanation will be given of the amplitude correction data that is stored in the first memory. First, it is assumed that V1(t) represents the envelope signal voltage of the input signal S1 from the input terminal T1; Vpd(t) represents the envelope signal voltage of the output S22 of the variable gain part AM; and Vc(t) represents the voltage of the control signal S11 that is applied to the control terminal of that variable gain part AM. When such assumption is made as such, the voltage of the amplitude correction data that is stored in the memory M1 is that Vc(t).

It is now assumed that the gain G(vc) of the variable gain part AM is expressed by the equation:

$$G(vc)=1+a*Vc(t) \quad \text{[First Equation]}$$

where the symbol (a) represents a conversion coefficient. And, the envelope voltage Vpd(t) of the output S22 of the variable gain part AM is expressed as follows.

$$Vpd(t)=V1(t)*G(vc) \quad \text{[Second Equation]}$$

When substituting the second equation into the first equation, the equation:

$$Vpd=V1(t)*[1+a*Vc(t)] \quad \text{[Third Equation]}$$

is obtained. Determining the Vc(t) from that third equation, $$Vc(t)=(1/a)*[Vpd(t)/V1(t)-1] \quad \text{[Fourth Equation]}$$

is obtained.

The Vpd(t) in the fourth equation can be determined by measuring the input/output characteristic of the power amplifier PA the distortion of that is to be corrected. Accordingly, using the thus-determined value of the Vpd(t), there is calculated the fourth equation to thereby obtain the voltage Vc(t). And, this voltage Vc(t) is stored in the memory M1 beforehand.

Next, an explanation will be given of the first to fourth routes (1) to (4). First, an explanation will be given of the first route (1). In the memory M1, there is stored beforehand the amplitude correction data S7 that corresponds to its relevant address. The signal S3 obtained by digitizing the envelope signal S2 is supplied to the memory M1 as an address. From the memory M1 there is read out the amplitude correction data S7 corresponding to that signal S3 address. The amplitude correction data S7 is added to the for-adaptive-compensation data S37 as later described. Then the resulting data is converted to the analog signal S10 by the digital/analog converter D/A1. That analog signal S10 is passed through the low pass filter LPF1 for eliminating the digital noises. And the signal S11 obtained by eliminating those digital noises is input to the control terminal of the gain-variable part AM to thereby control the gain of the passage signal of the gain-variable part AM.

The operation of the second route (phase-compensation route) (2) is approximately the same as that of the first route (1). Namely, the signal S3 that has entered the second route (2) accesses the second memory M2 the construction of that is the same as that in the case of the first route (amplitude correction route) (1). Resultantly, that signal S3 thereby causes the phase correction data S4 stored in the memory M2 beforehand to be read out therefrom. That phase correction data S4 is converted to the analog signal S5 by the second digital/analog converter D/A2. That signal S5 is passed through the second low pass filter LPF2 and the output signal S6 therefrom is input to the control terminal of the phase shifter PH. That output signal S6 thereby controls the passage phase of the signal passing through the phase shifter PH. That output signal compensates the phase distortion of the power amplifier PA the distortion of that is to be compensated.

In case no changes such as a temperature fluctuation occur, the distortion to be compensated of the power amplifier PA is compensated through the operations of the above-described first and second compensation routes (1) and (2). However, in case the temperature, etc. has changed, the compensation based on the mere use of only those two routes (1) and (2) becomes incomplete. Resultantly, the use of the third route (3) that copes with that compensation becomes necessary.

The operation of the adaptive compensation using the third route (3) will hereafter be explained. The envelope S2 of the input high-frequency signal S1 supplied from the input terminal T1 are subtracted each other by the analog subtractor SUB. And, the sign of the subtracted result is obtained through the operation of the sign detector CMP. And, in the logical conversion part Lgc, there is output therefrom as the signal S34 a digital signal of +1 when that sign has a plus value. When that sign has a minus value, a digital signal of −1 is output therefrom as the signal S34.

On the other hand, the signal S3 obtained by digitizing the input signal S1 from the input terminal T1 is supplied as an address to the memory RAM1. Thereby, the corresponding data S36 that corresponds to that address is read out from the memory RAM 1, and that data S36 is temporarily latched by the latch circuit LCH. The thus-latched signal S37 and the signal S34 from the logical conversion part Lgc are added up together by the adder ADD1, whereby the addition signal S35 is written into the memory RAM1. Namely, in order to switch the mode of the memory RAM 1 from the mode of read-out to the mode of write-in, there is performed the operation of keeping temporarily stored in the latch circuit LCH the data that has been once read out.

In case a sufficiently high level of compensation cannot be achieved when using the first route (1) and the output of the power amplifier PA has a small value relative to the input signal thereto, the corresponding data in the memory RAM 1 is made +1.

In case its envelope signal fluctuates as in the case of, for example, a QPSK (Quadrature Phase Shift Keying) modulated wave, the high-frequency signal S1 input to the input terminal T1 becomes to be that the same voltages occur on a time axis with a certain value of probability. Accordingly, when the input envelope S2 has indicated the same value at a point in timing that comes somewhere next, the data within the memory RAM1 is output as the signal S37 through the latch circuit LCH. That signal S37 is added up, in the adder ADD2, together with the amplitude correction data S7 in the first route (1). And, the resulting addition output is applied to the control terminal of the variable-gain control part AM through the digital/analog converter D/A1 and the low pass filter LFP1. This operation continues to be performed until the difference between the envelope S3 of the input high-frequency signal S1 and the envelope S11 of the output S10 of the power amplifier PA the distortion of that is to be compensated becomes none. The same applies to a case, as well, where owing to the gain fluctuation of the variable-gain control part AM the output of the power amplifier PA has a great value relative to the input signal thereof.

As described above, the data that is written into the memory RAM1 is sequentially added to or subtracted from the immediately preceding data. Therefore, the plus data or minus data is successively cumulative-produced. Resultantly, it is cumulative-produced through the integrating operation and it as a result becomes a great value. The result is that correction is achieved.

Figure 4:
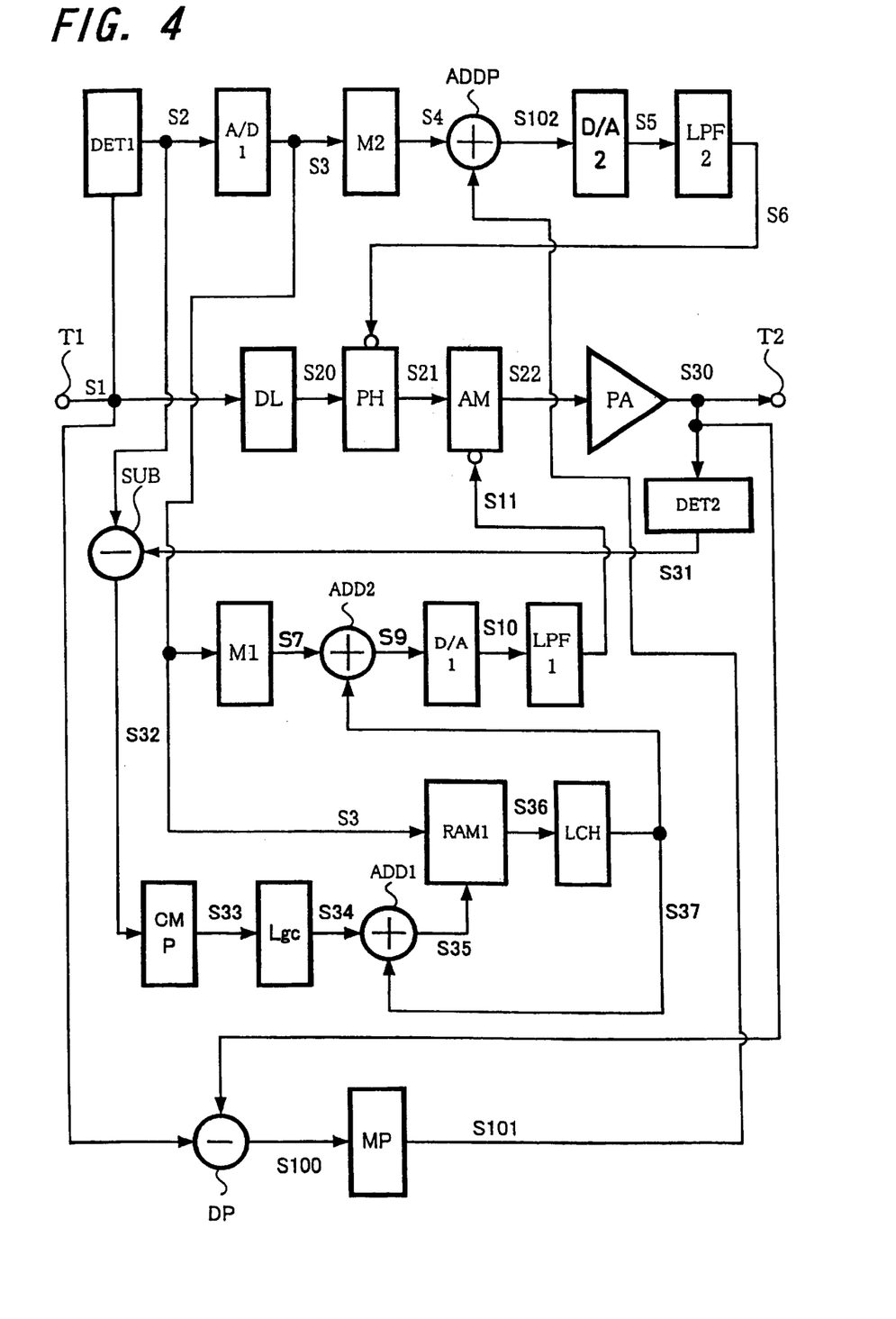
FIG. 4 is a block diagram illustrating another example of an adaptive distortion-compensation apparatus according to the embodiment of the present invention.

FIG. 4 is a block diagram illustrating the adaptive distortion-compensation apparatus according to another embodiment of the present invention. In FIG. 4, the portions that correspond to those of FIG. 3 are denoted by like reference symbols. This adaptive distortion-compensation apparatus of FIG. 4 is an example wherein a technique of performing adaptive compensation that uses a transition of phase is added to the adaptive distortion-compensation apparatus of FIG. 3. The portions in that the adaptive distortion-compensation apparatus of FIG. 2 differs from that of FIG. 3 will now be explained. An input signal S1 from the input terminal T1 and an output signal S30 of the power amplifier PA are input to a phase-difference detection part DP. A phase-difference detection output thereof is output as a voltage S100. Using this detection output S100 as an address, it is supplied to a third memory MP, from which there is output data S101 corresponding to that address. This output S101 of the memory MP is added to the output S4 of the memory M2 in a third adder ADDP. This adder ADDP outputs that addition result as a signal S102, which is supplied to a digital/analog converter D/A2, in which that addition output result S102 is converted to an analog signal S5.

Next, the operation of this adaptive distortion-compensation apparatus of FIG. 4 will be explained. In case the data of the second memory M2 having stored therein phase compensation table is appropriate, no output appears at the phase-difference detection part DP, so no operation is performed. In case that data is inappropriate, there appears a voltage S100 that depends upon the difference in phase between the input and output signals of the power amplifier PA. In the third memory MP, there is stored the same data as that in the read-out/write-in memory RAM1, and said signal S100 is supplied as an address to the memory MP. And the signal S101 corresponding to that address is read out therefrom, and that signal S101 is added, in the third adder ADDP, to the output M2 storing therein the phase compensation table. Resultantly, that addition signal contributes to controlling the phase control addition signal contributes to controlling the phase control part PH.

Figure 5:
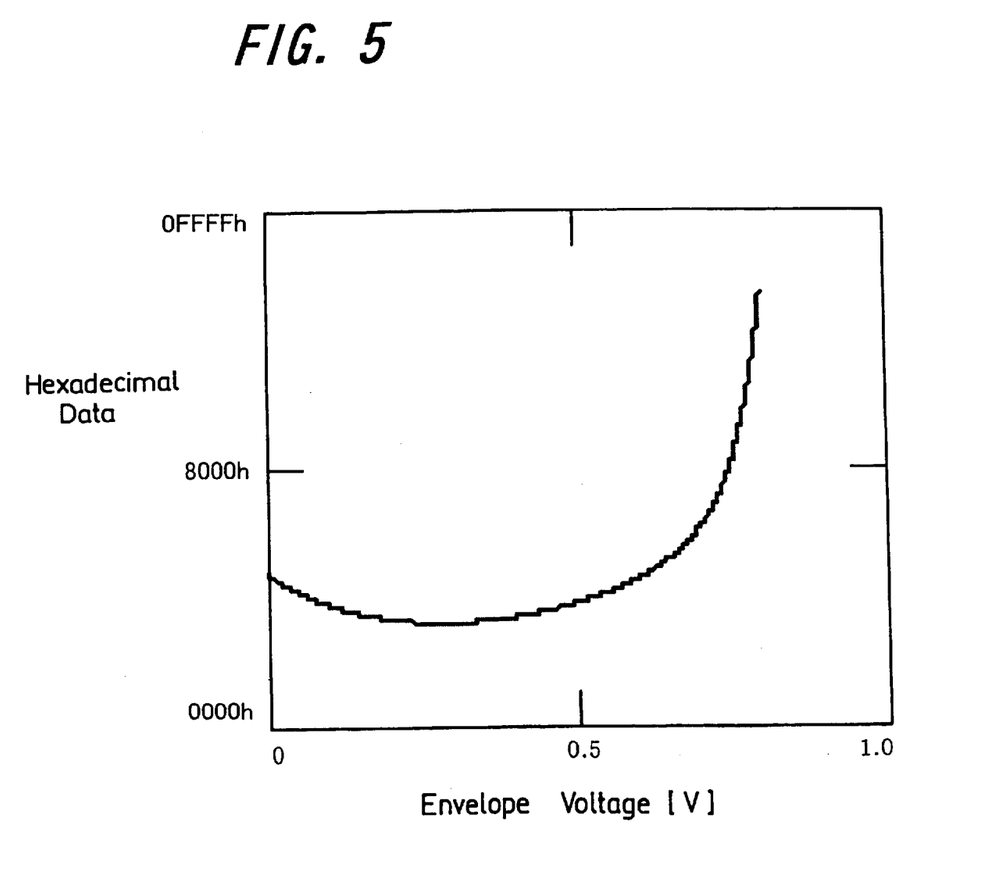
FIG. 5 is a characteristic diagram illustrating the characteristic of data of an amplitude compensation table at room temperature that is stored in a memory M1.
Figure 6:
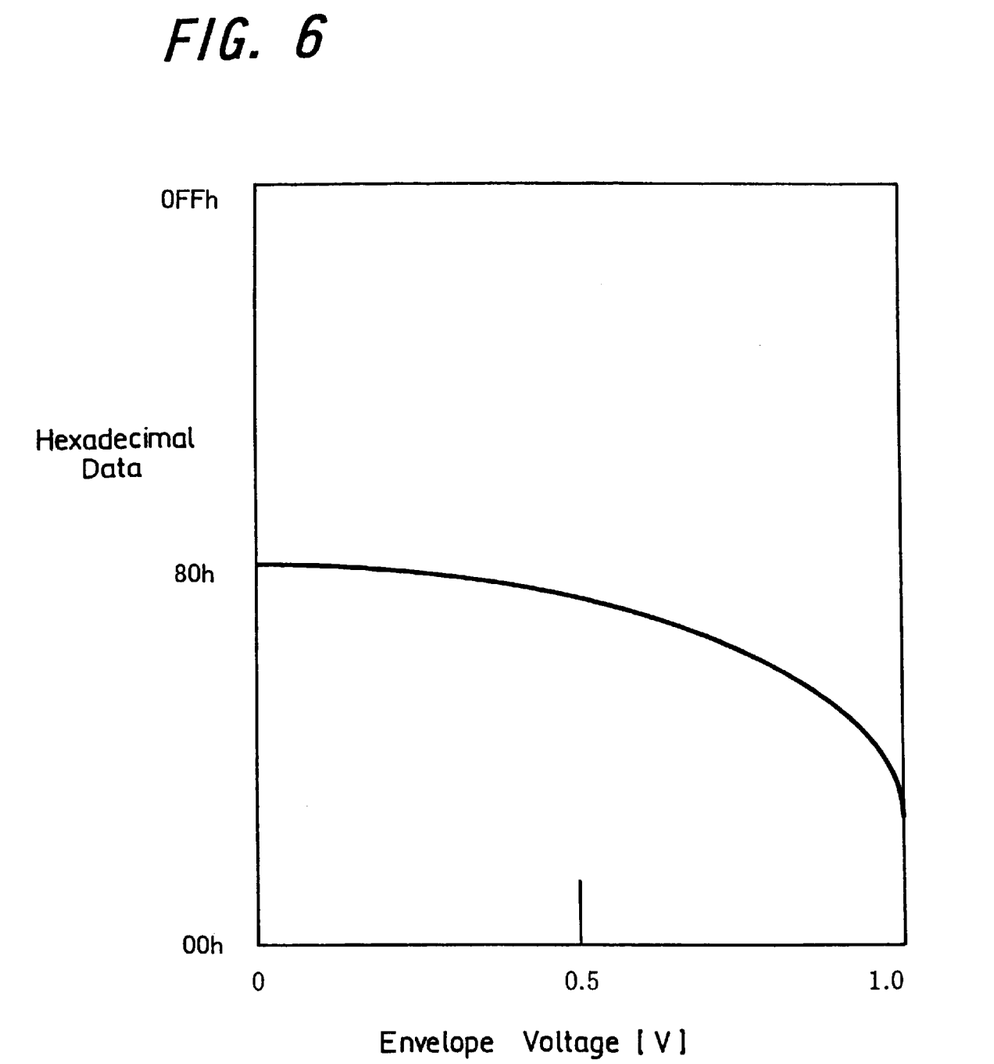
FIG. 6 is a characteristic diagram illustrating the characteristic of data of a phase compensation table at room temperature that is stored in a memory M2.
Figure 7:
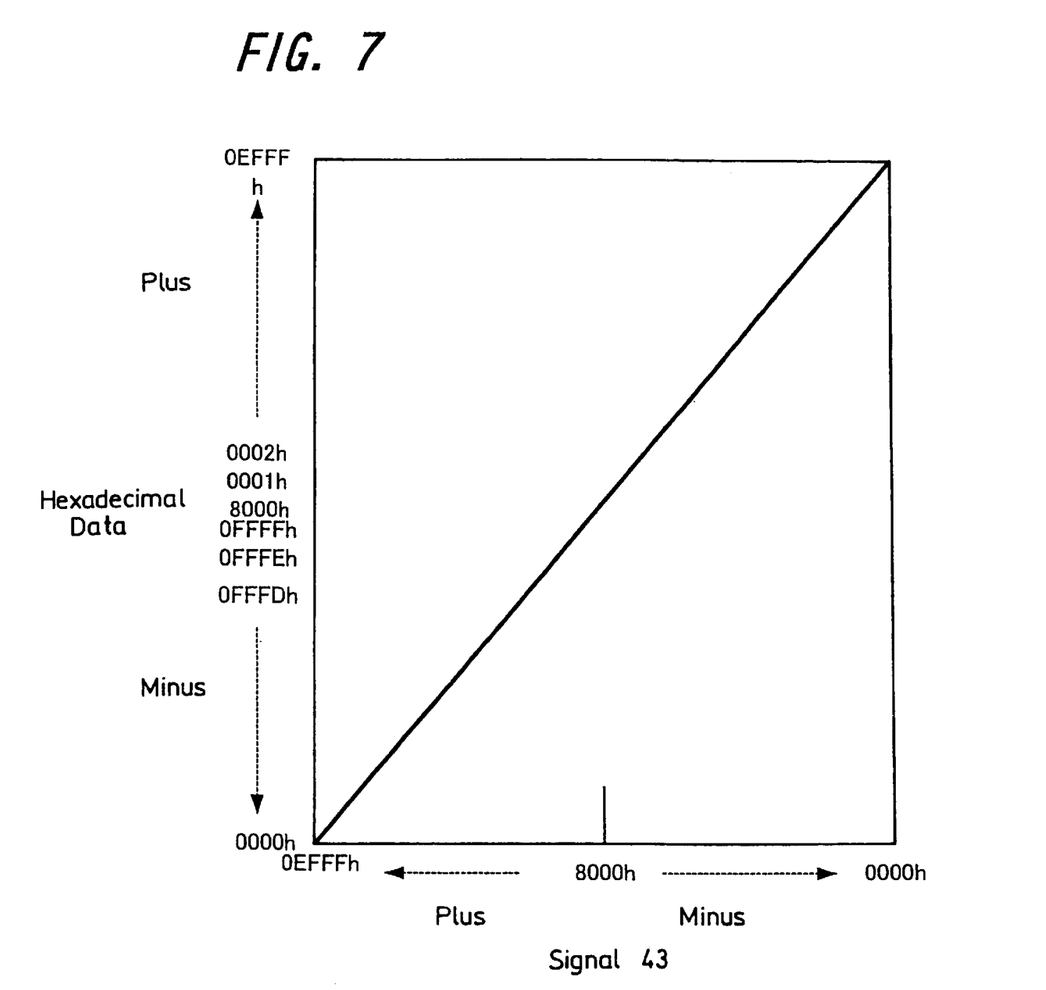
FIG. 7 is a characteristic diagram illustrating data that is stored in a memory MP.

Next, an explanation will be given of the data stored in each of the memories M1, M2, and MP of FIG. 4. FIG. 5 illustrates an example of the data that is stored in the memory M1. The abscissa axis represents the voltage of the envelope signal S1 while the ordinate axis represents the data (hexadecimal data) for amplitude correction. That data is the one with respect to that the conversion made using the above-described equation has been performed. FIG. 6 illustrates data that is stored in the memory M2. That data is the one that can perform phase compensation. FIG. 7 illustrates data that is stored in the memory MP. That data is the one that is linearly converted according to the values of the signal S43 and with respect to the plus or minus values thereof.

Figure 8:
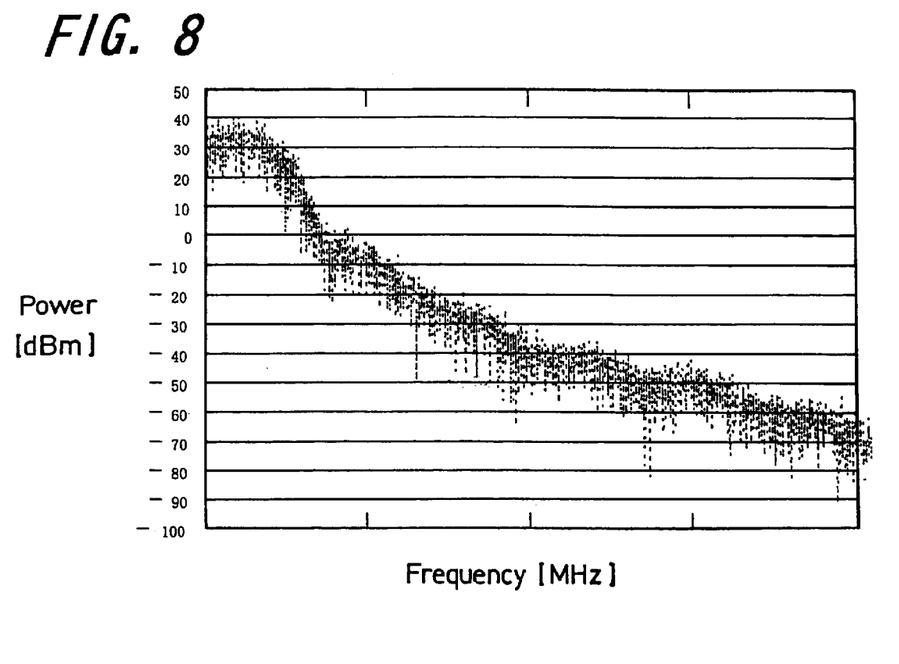
FIG. 8 is a spectrum diagram illustrating an example of the adaptive distortion compensation of a distortion spectrum that occurs in the power amplifier.
Figure 9:
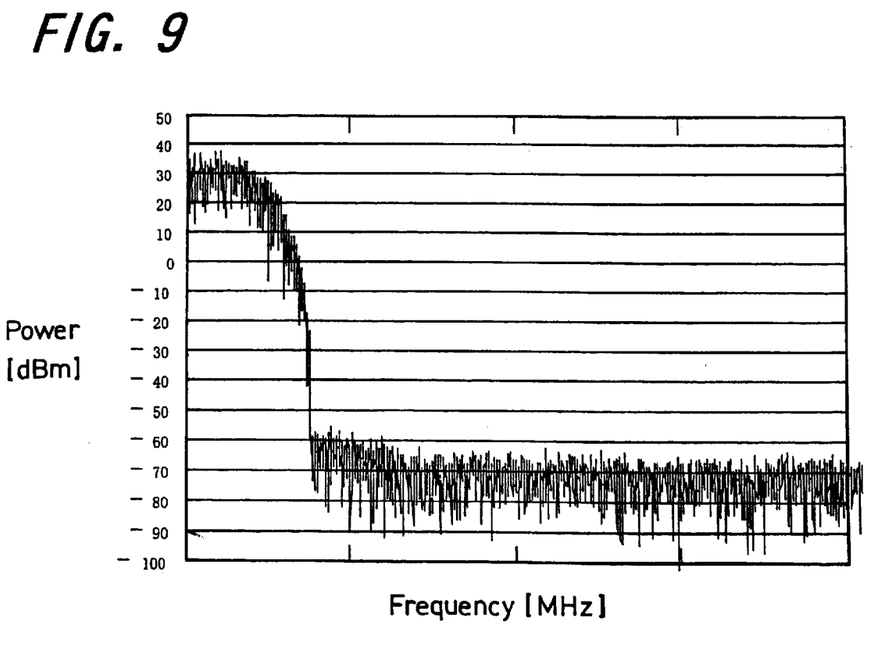
FIG. 9 is a spectrum diagram illustrating an example of the distortion compensation at room temperature.

Next, an example wherein adaptive distortion compensation is performed through the operation of the above-described adaptive distortion-compensation apparatus will be explained. FIGS. 8 and 9 each illustrate an example of distortion compensation in case of 25° C. (room temperature). FIG. 8 illustrates a spectrum containing therein distortions that occur in the power amplifier PA, while FIG. 9 illustrates a state in that distortion compensation is performed through the data stored in each of the memories M1 and M2.

Figure 10:
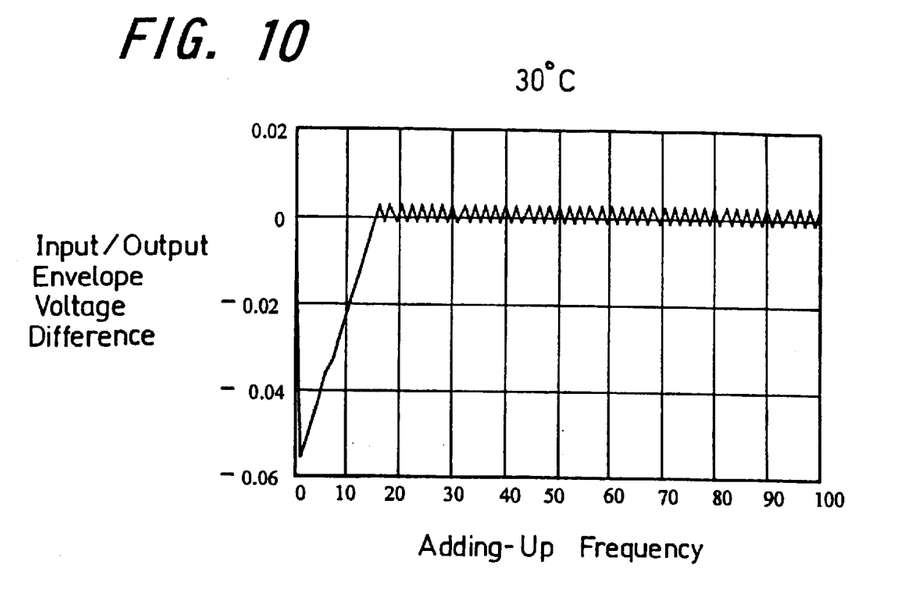
FIG. 10 is a characteristic diagram illustrating an example of the adaptive compensation at a temperature of −30° C.
Figure 11:
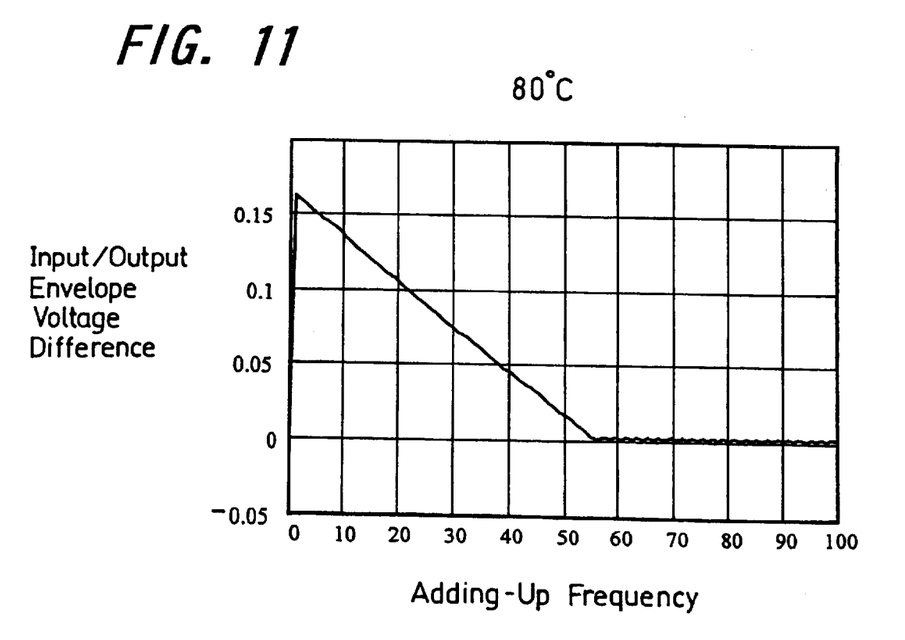
FIG. 11 is a characteristic diagram illustrating an example of the adaptive compensation at a temperature of 80° C.

FIGS. 10 and 11 illustrate the results that have been obtained through the performance of the adaptive compensation. FIG. 10 illustrates an example wherein the temperature is −30° C. The ordinate axis of the illustration represents the difference the input and the output envelope voltage, while the abscissa axis represents an adding-up number of times. It is seen that as the adding-up number of times increases, the difference between the envelope voltages decreases.

FIG. 11 illustrates a state in case of 80° C. wherein adaptive compensation is performed. On the high-temperature side, a decrease in the gain of the power amplifier occurs, which is followed by a decrease in the-loop gain of the feedback loop constituting the adaptive route. As a result of this, there appears the effect of that the adding-up number of times needed to decrease the distortion power increases.

Also, in FIG. 10, due to an increase in the gain on the low-temperature side, the difference between the input and the output envelope voltage converges from the positive side. Due to a decrease in the gain on the high-temperature side, in FIG. 11, conversely to FIG. 10, that difference converges from the negative side.

Figure 12:
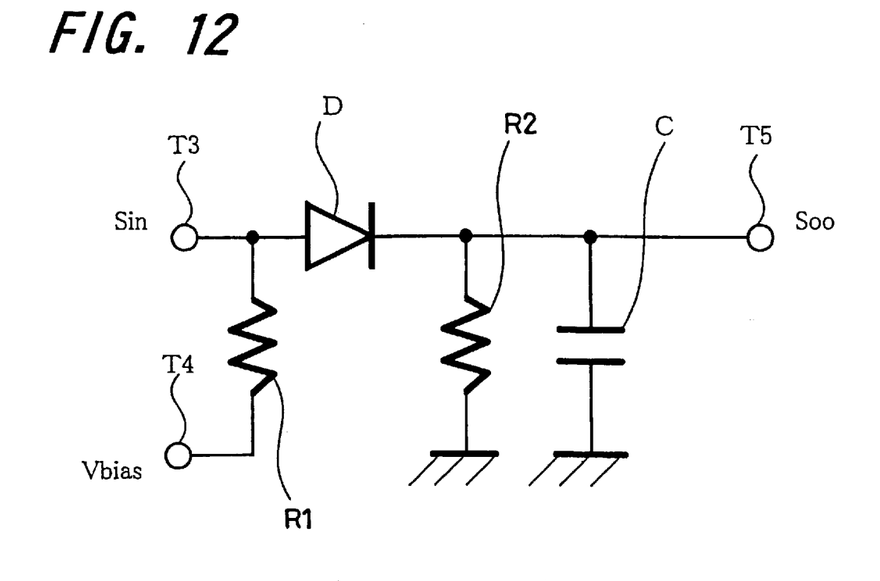
FIG. 12 is a circuit diagram illustrating an example of the specified circuit of an envelope detection part DET.

Examples of specified circuits of the respective relevant elements that constitute the above-described adaptive distortion-compensation apparatus of FIGS. 3 and 4 will now be explained. FIG. 12 illustrates an example of the specified circuit of each of the envelope detection parts DET1 and DET2. A diode D is provided. The anode thereof is connected to an input terminal T3 to that a high-frequency input signal Sin is input. And, the cathode thereof is connected to an output terminal T5 from that an envelope voltage Soo is output. In order to improve the non-linearity of the small-signal portion of the diode D, a bias voltage Vbias from an input terminal T4 is applied to the anode of the diode D through a bias resistor R1. The cathode of the diode D is grounded through a parallel circuit consisting of a resistor R2 and a capacitor C.

Figure 13:
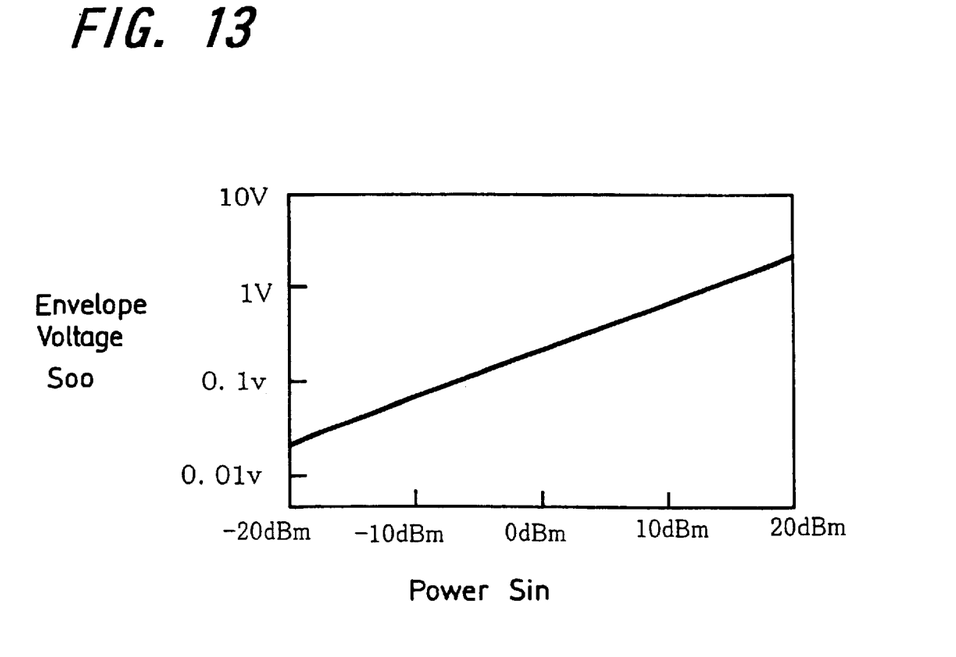
FIG. 13 is a characteristic diagram illustrating the characteristic an example of the specified circuit of that envelope detection part DET.

FIG. 13 illustrates the characteristic of the envelope voltage Soo with respect to the input signal (high-frequency power) Sin in FIG. 12.

Figure 14:
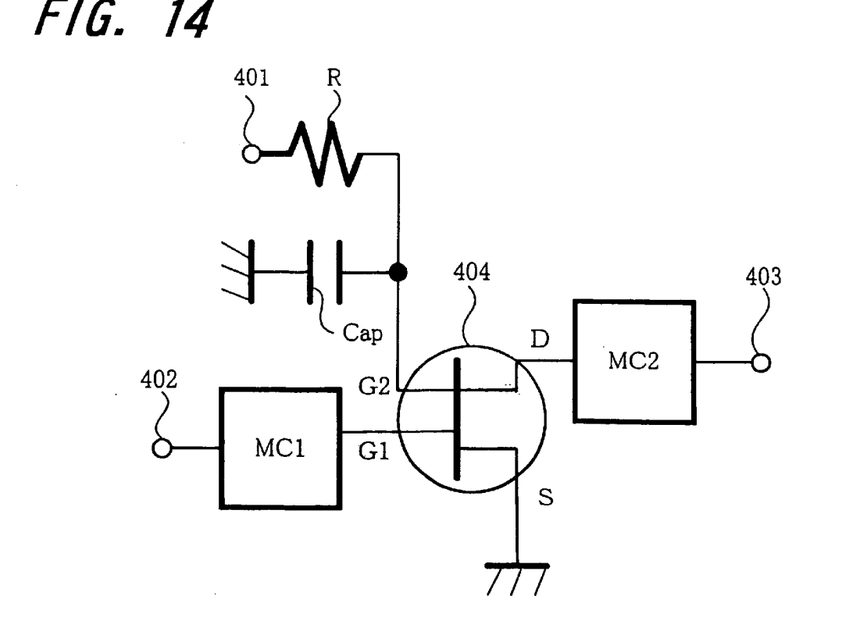
FIG. 14 is a circuit diagram illustrating an example of the specified circuit of a gain-variable part AM.

FIG. 14 illustrates an example of the specified circuit of the gain-variable part AM. A reference numeral 404 denotes a source-grounded/double gate type FET. An input terminal 402 having supplied thereto a high-frequency voltage is connected to a first gate G1 of the FET 404 through an input matching circuit MC1. A drain D of the FET 404 is connected, via an output matching circuit MC2, to an output terminal 403 from that a high-frequency output signal, that has been controlled, is output. A second gate G2 of the FET 404 is grounded through a capacitor Cap. On the other hand, a control terminal 401 to that a control voltage Vc is supplied is connected to a second gate G2 of the FET 404.

In the circuit constituting the gain-variable part AM, utilizing the fact that the mutual conductance of the double gate type FET 404 depends upon the voltage applied to the second gate G2, the gain thereof is controlled.

Figure 15:
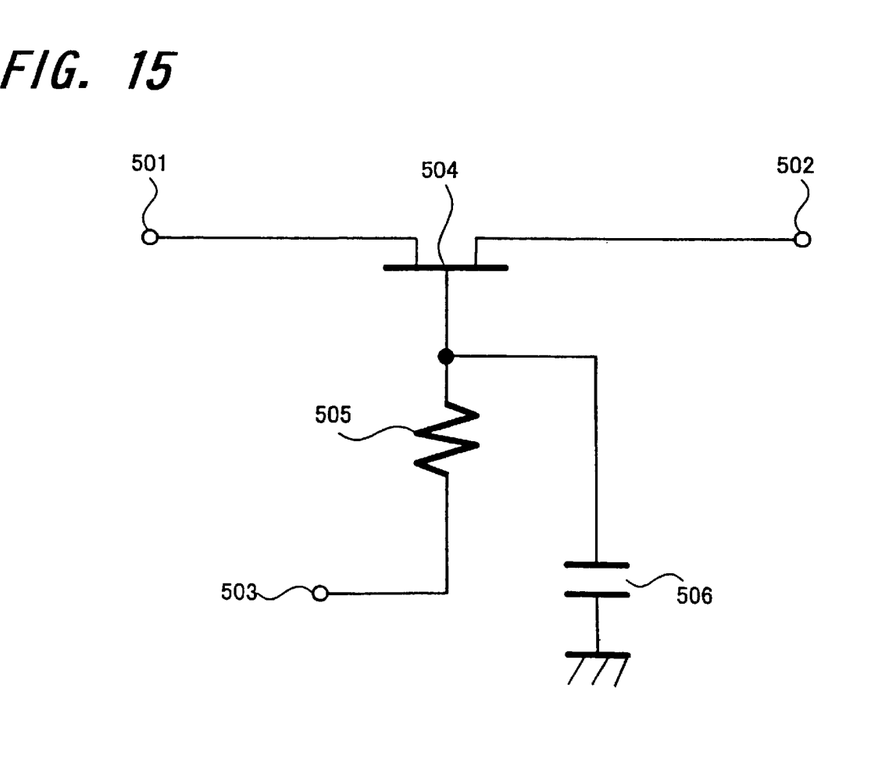
FIG. 15 is a circuit diagram illustrating another example of the specified circuit of the gain-variable part AM.

FIG. 15 illustrates another example of the specified circuit constituting the gain-variable part AM. A reference numeral 504 denotes a gate-grounded type FET. An input terminal 501 is connected to the source of the FET 504, the drain of that is connected to an output terminal 502. A control voltage from a control terminal 503 is applied to the gate of the FET 504 via a resistor 505 to thereby control the amount of passage loss between the source and drain of the FET 504. The gate of the FET 504 is grounded via a capacitor 506.

As the gain-variable part AM, the one the passage phase of that doesn't fluctuate against the fluctuation of the gain is preferable. In view of this, the specified circuit illustrated in each of FIGS. 14 and 15 satisfies such conditions.

Figure 16:
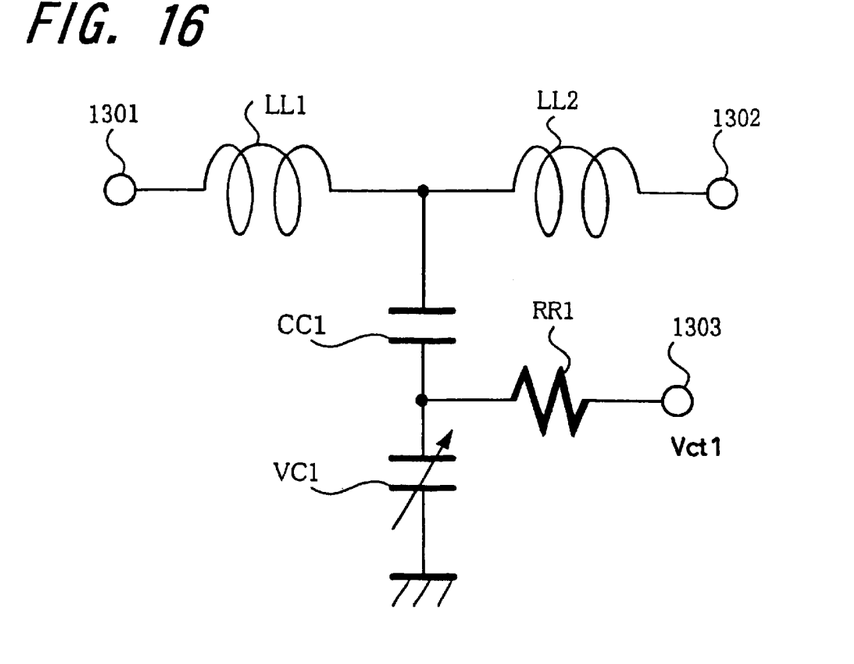
FIG. 16 is a circuit diagram- illustrating an example of the specified circuit of a phase shifter PH.

FIG. 16 illustrates an example of the specified circuit of the phase shifter PH. Coils LL1, LL2 are connected in series between an input terminal 1301 and an output terminal 1302. The center of the connection between the coils LL1 and LL2 is grounded through the sequential intermediary of a capacitor CC1 and a variable capacitor VC1 such as a variable capacitor diode. A control signal Vct1 from a control terminal 1303 is applied to the center of the connection between the capacitor CC1 and the variable capacitor VC1 through a resistor RR1. And, the phase of the high-frequency signal passing between the input terminal 1301 and the output terminal 1302 is transited due to the voltage of the control signal Vct1 that is applied to the control terminal 1303.

Figure 17:
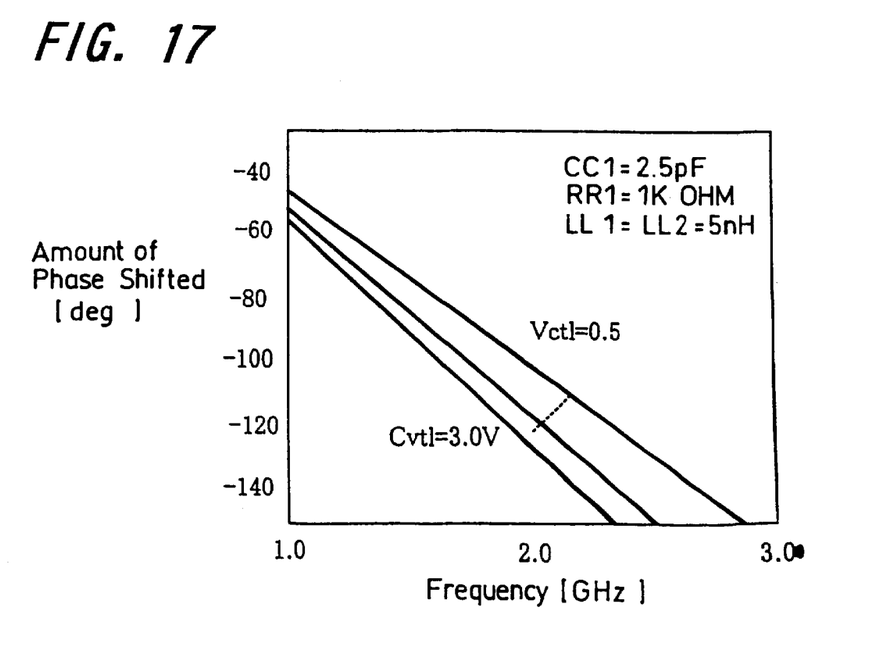
FIG. 17 is a characteristic diagram illustrating a concrete example of the phase shifter PH.

FIG. 17 illustrates an example of the characteristic of the phase shifter PH of FIG. 16. In FIG. 15, there are illustrated examples of the constants of the elements constituting the phase shifter PH of FIG. 13 in the case where that characteristic is obtained. Although differing depending upon the value of the frequency, generally, a phase transition of from 10 to 40 degrees occurs while the voltage of the control signal Vct1 ranges from 0.5 (V) to 3.0 (V).

Figure 18:
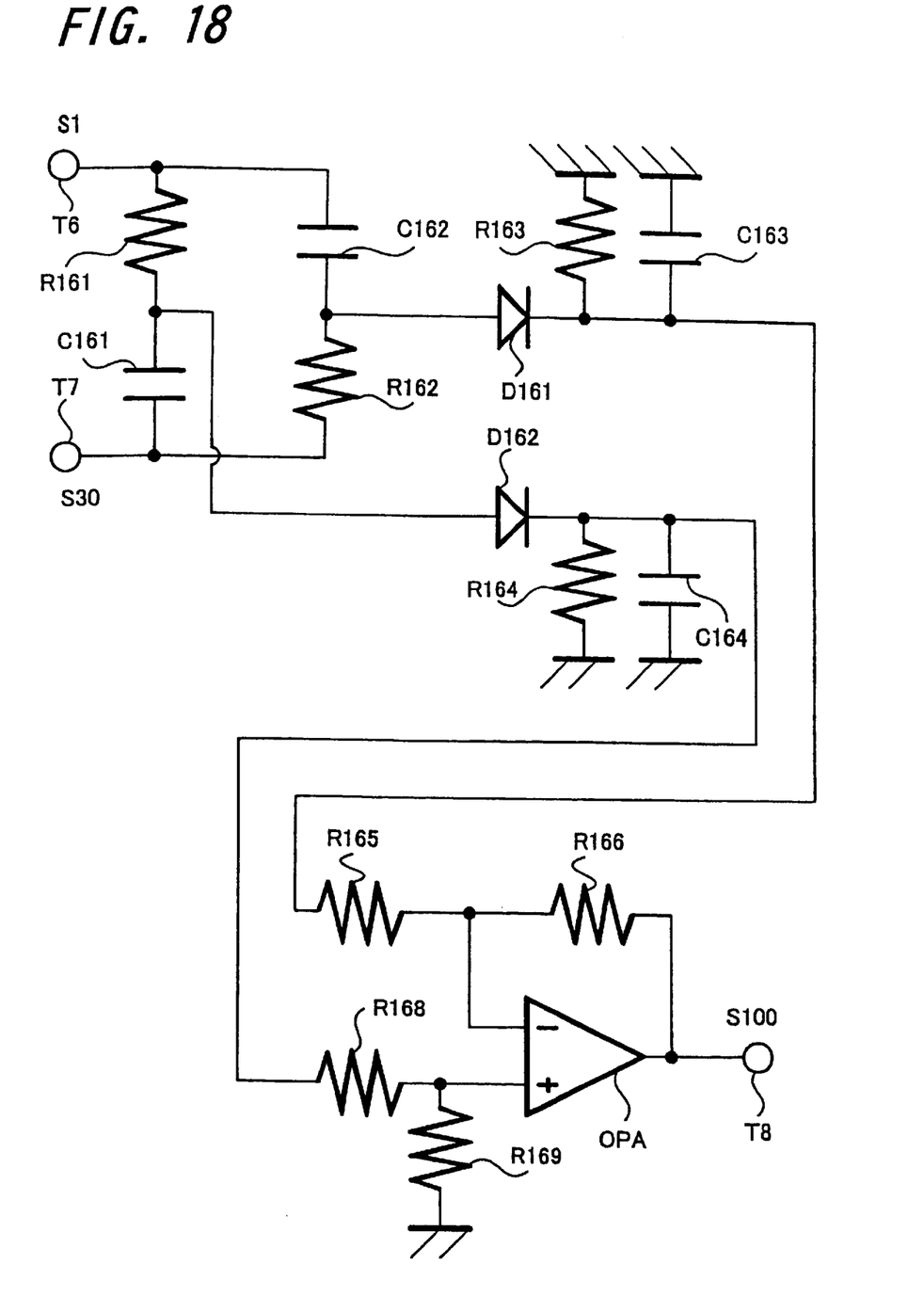
FIG. 18 is a circuit diagram illustrating a specified circuit of a phase-difference detection part DP.

FIG. 18 illustrates an example of the specified circuit of the phase-difference detection part DP. Resistors R161, R162 and capacitors C161, C162 are connected so as to constitute a bridge circuit. The difference voltage between signals S1 and S30 is divided by the resistor R161 and the capacitor C161. And, the voltage obtained at the center of the connection between those two elements is supplied to the anode of a diode D162 of a diode detector circuit the diode D162 and cathode of that are grounded via a parallel circuit consisting of a resistor R164 and a capacitor C164. Similarly, the difference voltage between the signals S1 and S30 is divided by a capacitor C162 and a resistor R162. And, the voltage obtained at the center of the connection between the two elements is supplied to the anode of a diode D161 of a diode detector circuit that is grounded via a parallel circuit of a resistor R163 and a capacitor C163.

The detector output of the diode detector circuit including the diode D161 is supplied to an inversion input terminal of an operation amplifier OPA via a resistor R165. On the other hand, the detector output of the diode detector circuit including the diode D162 is supplied to a non-inversion input terminal of the operation amplifier OPA via a resistor R168. Between an output terminal and the inversion input terminal of the operation amplifier OPA there is connected a resistor R166. The non-inversion input terminal of the operation amplifier OPA is grounded via a resistor R169.

In the circuit constituting the phase-difference detection part DP, from an output terminal T8 that has been drawn out from the output terminal of the operation amplifier OPA there is output an output signal S100 the phase of that is proportionate to the phase difference between the two input signals S1 and S30.

According to the present invention, it has been arranged that data for use for adaptive compensation that is necessary for pre-distortion is obtained through envelope detection of the distortion components of the power amplifier. Therefore, it is possible to simply realize the adaptive distortion-compensation apparatus without requiring the use of an orthogonal demodulator the circuit scale of that is huge. Also, compensation of the distortion is performed through the detection of the distortion components made by adding up the differences between the input and the output signal together. Therefore, there is the merit that even a small magnitude of distortion components can be compensated for. In addition, while in performing adaptive compensation there is performed analog subtraction of the input and the output signal, at that time there is only determined the sign of the subtracted result. Therefore, there is no need to handle a minute level of voltage signal, nor is there any need to use a multi-bit analog/digital converter simultaneously.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. An adaptive distortion-compensation apparatus comprising:

first envelope detection means for obtaining a first envelope detection signal of an input signal;

first storage means, supplied with an address signal based on the first envelope detection signal, for outputting an amplitude compensation data signal corresponding to the address signal;

second storage means, supplied with the address signal based on the first envelope detection signal, for outputting an output data signal corresponding to the address signal, and for writing write-in data;

latch means for latching the output data signal read out from the second storage means;

a power amplifier;

second envelope detection means, supplied with an output signal of the power amplifier, for obtaining a second envelope detection signal;

sign detection and logical conversion means for outputting positive and negative digital signals in accordance with a positivity or a negativity of a difference between the first envelope detection signal and the second envelope detection signal;

first addition means for adding an output signal of the latch means and the output signal of the sign detection and logical conversion means and for supplying the added signals to the second storage means as the write-in data;

second addition means for adding the output signal of the first storage means and the output signal of the latch means and for obtaining a second addition output signal;

a digital to analog conversion means for converting the output signal of the second addition means into an analog signal and for supplying the analog signal to the power amplifier; and gain control means, supplied with the input signal, for controlling a gain of the input signal in accordance with the output of the digital to analog conversion means and for supplying the gain-controlled input signal to an amplification circuit.

2. The adaptive distortion-compensation apparatus according to claim 1, wherein said digital to analog conversion means comprises first digital to analog conversion means and further comprising:

third storage means, supplied with the address signal based on the first envelope detection signal, for outputting a phase compensation data signal corresponding to the address signal;

second digital to analog conversion means for converting the phase compensating data signal outputted from the third storage means into an analog signal; and phase control means, supplied with the input signal, for controlling a phase of the input signal in accordance with an output signal of the second digital to analog conversion means and for supplying a phase-controlled resultant input signal to the gain control means.

3. The adaptive distortion-compensation apparatus according to claim 2, further comprising:

delay means, provided before the phase control means, for delaying the input signal by a predetermined time.

4. The adaptive distortion-compensation apparatus according to claim 2, further comprising:

phase difference detection means for detecting a phase difference between the input signal and an output signal of the power amplifier;

fourth storage means, supplied with an address signal based on a phase difference detection signal output from the phase difference detection means, for outputting an output data signal corresponding to the phase difference detection based address signal; and third addition means for adding an output signal of the third storage means and an output signal of the fourth storage means.

* * * * *